United States Patent
Ogawa et al.

(10) Patent No.: US 11,390,746 B2
(45) Date of Patent: Jul. 19, 2022

(54) CURABLE POLYORGANOSILOXANE COMPOSITION, CURED BODY OBTAINED BY CURING SAID COMPOSITIONS, AND ELECTRONIC DEVICE COMPRISING THE SAME

(71) Applicants: DOW SILICONES CORPORATION, Midland, MI (US); DOW TORAY CO., LTD., Tokyo (JP)

(72) Inventors: Takuya Ogawa, Ichihara (JP); Yungjin Park, Chungcheongbuk-do (KR); Juyoung Yook, Chungcheongbuk-do (KR)

(73) Assignees: Dow Silicones Corporation, Midland, MI (US); Dow Toray Co., Ltd., Tokyo (JP)

( * ) Notice: Subject to any disclaimer, the term of this patent is extended or adjusted under 35 U.S.C. 154(b) by 102 days.

(21) Appl. No.: 16/758,973

(22) PCT Filed: Oct. 26, 2018

(86) PCT No.: PCT/US2018/057702
§ 371 (c)(1),
(2) Date: Apr. 24, 2020

(87) PCT Pub. No.: WO2019/084397
PCT Pub. Date: May 2, 2019

(65) Prior Publication Data
US 2020/0347230 A1    Nov. 5, 2020

(30) Foreign Application Priority Data
Oct. 27, 2017   (KR) .................. 10-2017-0141368

(51) Int. Cl.
*C08L 83/04* (2006.01)
*C08G 77/38* (2006.01)

(52) U.S. Cl.
CPC .............. *C08L 83/04* (2013.01); *C08G 77/38* (2013.01); *C08L 2205/025* (2013.01)

(58) Field of Classification Search
CPC ........ C08G 77/50; C08G 77/12; C08G 77/20; C08G 77/38; C08L 83/04
See application file for complete search history.

(56) References Cited

U.S. PATENT DOCUMENTS

| | | | |
|---|---|---|---|
| 3,816,282 A | 6/1974 | Viventi | |
| 4,052,529 A | 10/1977 | Bokerman et al. | |
| 4,070,526 A | 1/1978 | Colquhoun et al. | |
| 4,279,717 A | 7/1981 | Eckberg et al. | |
| 4,348,454 A | 9/1982 | Eckberg | |
| 4,528,081 A | 7/1985 | Lien et al. | |
| 4,576,999 A | 3/1986 | Eckberg | |
| 4,587,137 A | 5/1986 | Eckberg | |
| 4,587,173 A | 5/1986 | Lat et al. | |
| 4,603,168 A | 7/1986 | Sasaki et al. | |
| 4,699,802 A | 10/1987 | Nakos et al. | |
| 5,357,023 A | 10/1994 | Inoue et al. | |
| 5,714,557 A | 2/1998 | Kunzler et al. | |
| 6,417,309 B2 | 7/2002 | Amako et al. | |
| 2004/0116547 A1 | 6/2004 | Bennington | |
| 2010/0210769 A1 | 8/2010 | Hayashi et al. | |
| 2014/0203323 A1* | 7/2014 | Ozai ..................... | C08F 220/14 257/100 |

FOREIGN PATENT DOCUMENTS

| | | |
|---|---|---|
| CN | 1204338 A | 1/1999 |
| CN | 1834187 A | 9/2006 |
| CN | 101743281 A | 6/2010 |
| CN | 102295771 A | 12/2011 |
| CN | 102558730 A | 7/2012 |
| CN | 103044638 A | 4/2013 |
| CN | 103937405 A | 7/2014 |
| CN | 105441012 A | 3/2016 |
| CN | 106701011 A | 5/2017 |
| CN | 106947429 A | 7/2017 |
| EP | 3222689 A1 | 9/2017 |
| JP | H068334 A | 1/1994 |
| JP | 3235030 B2 | 12/2001 |
| JP | 2013203794 A | 10/2013 |
| WO | 2011056832 A1 | 5/2011 |
| WO | 2016141547 A1 | 9/2016 |

OTHER PUBLICATIONS

Gustavo Guzman, et al., "High Strength Bimodal Amphiphilic Conetworks for Immunoisolation Membranes: Synthesis, Characterization, and Properties", Macromolecules, vol. 48, Aug. 19, 2015, pp. 6251-6262.
Machine assisted English translation of JPH068334A obtained from https://patents.google.com/patent on Jul. 2, 2021, 5 pages.
Machine assisted English translation of CN1934187A obtained from https://patents.google.com/patent on Jul. 2, 2021, 11 pages.
Machine assisted English translation of CN102295771A obtained from https://patents.google.com/patent on Jul. 2, 2021, 8 pages.
Machine assisted English translation of CN102558730A obtained from https://patents.google.com/patent on Jul. 2, 2021, 13 pages.
Machine assisted English translation of CN103044638A obtained from https://patents.google.com/patent on Jul. 2, 2021, 5 pages.
Machine assisted English translation of CN105441012A obtained from https://patents.google.com/patent on Jul. 2, 2021, 10 pages.

(Continued)

*Primary Examiner* — Kuo Liang Peng
(74) *Attorney, Agent, or Firm* — Warner Norcross + Judd LLP

(57) ABSTRACT

The present disclosure relates to a light curable, light-heat or light-moisture dually curable, or light-heat-moisture multiple curable polyorganosiloxane composition, which has ease of synthesis, low volatile content, rapid curability, excellent toughness and/or superior optical/physical stability in a variety of fields such as coating materials, encapsulants, sealants and adhesives, a cured body obtained by curing said compositions, and an electronic device comprising the same.

17 Claims, No Drawings

(56) References Cited

OTHER PUBLICATIONS

Machine assisted English translation of CN105441012A obtained from https://patents.google.com/patent on Jul. 2, 2021, 8 pages.
Machine assisted English translation of CN106947429A obtained from https://patents.google.com/patent on Jul. 2, 2021, 7 pages.
International Search Report for PCT/US2018/057702 dated Feb. 12, 2019, 4 pages.
Machine assisted English translation of JP3235030B2 obtained from https://patents.google.com/patent on Apr. 23, 2020, 5 pages.
Machine assisted English translation of JP2013203794A obtained from https://patents.google.com/patent on Apr. 23, 2020, 10 pages.

\* cited by examiner

CURABLE POLYORGANOSILOXANE COMPOSITION, CURED BODY OBTAINED BY CURING SAID COMPOSITIONS, AND ELECTRONIC DEVICE COMPRISING THE SAME

CROSS-REFERENCE TO RELATED APPLICATIONS

This application is the National Stage of International Appl. No. PCT/US2018/057702 filed on 26 Oct. 2018, which claims priority to and all advantages of Korean Patent Application No. 10-2017-0141368, filed on 27 Oct. 2017, the content of which is incorporated herein by reference.

TECHNICAL FIELD

The present disclosure relates to a curable polyorganosiloxane composition, a cured body obtained by curing said compositions, and an electronic device comprising the same.

BACKGROUND ART

A polyorganosiloxane composition is widely used in the field of not only consumer products but also industrial materials such as coating materials, encapsulants, sealants, adhesives, coatings, potting compounds and the like. The polyorganosiloxane composition may be classified as light curable (UV-Vis curable), heat curable (High Temperature Vulcanizing; HTV), moisture curable (Room Temperature Vulcanizing; RTV), or dually or multiple curable of the combination thereof. They may be produced by mixing a compound having a light curable, heat curable and/or hydrolysable group with a crosslinker and/or a catalyst. That is, the light curable polyorganosiloxane composition initiates crosslinking by electromagnetic radiation, the heat curable polyorganosiloxane composition is cured by heat, and the moisture curable polyorganosiloxane composition hydrolyzes certain groups in a silicon backbone by condensation reaction.

Ultraviolet radiation (UV) is one of the most widely used types of radiation because of its low cost, ease of maintenance, and low potential hazard to industrial users. Typical curing times are much shorter, and heat-sensitive materials can be safely coated and cured under UV radiation where thermal energy might damage the substrate.

Several UV-curable silicone systems are known: U.S. Pat. No. 3,816,282 (Viventi); U.S. Pat. No. 4,052,059 (Bokerman et al.); and U.S. Pat. No. 4,070,526 (Colquhoun) describe compositions wherein ω-mercaptoalkyl substituted polysiloxanes react with vinyl-functional siloxanes in a free-radical process when exposed to UV radiation. These compositions, however, often require scarce or expensive starting materials, have insufficient long-term reliability, or emit offensive odors (associated with the mercaptan group) which persist in the cured products.

UV-curable silicone resins with epoxy or acrylic functionality have been found recently to have the high degree of reactivity to make them suitable for release applications while avoiding the disadvantages of known UV-curable systems. Epoxy silicone compositions, such as described in U.S. Pat. No. 4,279,717 (Eckberg et al.), are especially advantageous for their rapid curing in the presence of certain onium salt photoinitiators. Acrylic-functional polymers, disclosed in U.S. application Ser. No. 239,297, filed Mar. 2, 1981, now U.S. Pat. No. 4,348,454, can be cured to adhesive coatings under UV radiation in the presence of various free-radical-type photoinitiators. Also, the light curable polyorganosiloxane composition has excellent curability in the surface region directly in contact with UV irradiation, but has poor curability and low hardness in a shadow area.

A light-heat dually curable polyorganosiloxane composition may exhibit the good properties such as heat resistance, cold resistance, and etc., due to the heat cure. However, it may cause cracking at the time of curing, and a cured body having a high coefficient of thermal expansion may be formed when being cured. Also, if such a cured body is integrated with another member, there is a limitation that peeling at the interface may occur.

U.S. Pat. No. 4,587,173 (Eckberg) discloses dual curing silicone compositions using heat and UV light as separate cross-linking mechanisms. This patent discloses a reactive polyorganosiloxane which requires direct silicon-bonded hydrogen atoms and direct silicon-bonded alkenyl radicals on the same or different polysiloxane chains. These compositions also contain a photoinitiator and a precious metal or precious metal-containing hydrosilylation catalyst. The presence of the photoinitiator allows cross-linking of the silicon-bonded hydrogen atoms and silicon-bonded alkenyl radicals. These compositions are said to be able to cross-link at room temperature or at elevated temperatures by the precious metal catalysis of the silicon-bonded hydrogen atoms and silicon-bonded alkenyl radicals. Platinum is among the catalysts used for the thermal hydrosilylation cure reaction.

U.S. Pat. No. 4,603,168 (Sasaki et al.) discloses a method of curing organopolysiloxane compositions which require the use of heat in combination with ultraviolet radiation. The compositions disclosed therein contain an organopolysiloxane having per molecule at least two alkenyl groups bonded directly to the silicone atom. Other organic groups may also be present, such as alkyl groups, halogenated alkyl groups, aryl groups, aralkyl groups, and alkaryl groups on the organopolysiloxane backbone. In addition, an organohydrogenpolysiloxane containing at least two organohydrogensiloxane or hydrogensiloxane units per molecule, a platinum catalyst, an addition-reaction retarder and a photoinitiator are also disclosed. The alkenyl groups must be bonded directly to the silicone atom without an organo group therebetween. The Eckberg and Sasaki patents are also limited to very thin coatings.

A light-moisture dually curable polyorganosiloxane composition does not require a separate heating process for the cure, and has the advantage of being able to cure the shadow areas that are blocked from UV. However, it has the limitation that it may cause a premature cure, a short available time and/or a shortened shelf life, in that the cure begins when moisture is exposed to the atmosphere. Dual-curing silicone compositions using ultraviolet light and moisture curing mechanisms are disclosed in U.S. Pat. No. 4,528,081 (Lien et al.) and U.S. Pat. No. 4,699,802 (Nakos et al.). These patents disclose compositions particularly useful for conformal coatings in electronic applications where the substrate has shadow areas which are not readily accessible to direct UV light and require moisture cure for cross-linking of those areas. Ordinarily, in addition to the photoinitiator present for radiation polymerization, a moisture curing catalyst such as an organotitanate must be present.

Meanwhile, the curing rate of the curable polyorganosiloxane composition may be dependent on a variety of factors including the type and number of reactive group(s). It is known that different groups exhibit different reactivities, and even the same type of curable group may exhibit different reactivities depending on the number of curable groups bonded to specific silicon atoms. Therefore, in order to exhibit superior properties in a light, heat and/or moisture cure, studies are underway to control various factors such as the type or number of reactive groups contained in the polyorganosiloxane composition.

PRIOR ART DOCUMENTS

Patent Documents

Patent Document 1: US Patent Appl. Publication No. 2004/0116547 A1 (Jun. 17, 2004)
Patent Document 2: International Publication No. WO2016/141547 A1 (Sep. 15, 2016)
Patent Document 3: U.S. Pat. No. 4,576,999 (Mar. 18, 1986)

SUMMARY OF INVENTION

Technical Problem

The object of the present disclosure is providing a light curable, light-heat or light-moisture dually curable, or light-heat-moisture multiple curable polyorganosiloxane composition, which has ease of synthesis, low volatile content, rapid curability, excellent toughness and/or superior optical/physical stability in a variety of fields such as coating materials, encapsulants, sealants and adhesives. Also, the object of the present disclosure is providing a cured body obtained by curing said compositions, and an electronic device comprising the same.

Solution to Problem

As a result of intensive studies to solve the technical problem above, the present inventors found that a light curable, light-heat or light-moisture dually curable, or light-heat-moisture multiple curable polyorganosiloxane composition, which is capable of obtaining a cured body having excellent properties in at least one of light and/or double curable, transmittance, physical tensile and elongation, may be produced by comprising a siloxane-based polymer regularly distributing a (meth)acrylic functional group in the pendant chain.

According to one embodiment of the present disclosure, the curable polyorganosiloxane composition comprises (A) a siloxane-based polymer having at least one Si-bonded (meth)acryloxy (C3-C20)alkyl radical group, and having polysiloxane units and sil-alkylene units formed by hydrosilylation reaction in the same molecule, and (B) a photoinitiator.

According to another embodiment of the present disclosure, said component (A) is obtained by hydrosilylation reaction between the following combinations (i) or (ii):

(i) siloxane compound having at least one Si-bonded (meth)acryloxy (C3-C20)alkyl radical group and at least two Si-bonded alkenyl group, and compound having at least two Si-bonded hydrogen atoms.

(ii) siloxane compound having at least one Si-bonded (meth)acryloxy (C3-C20)alkyl radical group and at least two Si-bonded hydrogen atoms, and compound having at least two groups including olefinic C=C double bond in the molecule.

According to another embodiment of the present disclosure, said component (A) is the siloxane-based polymer represented by the following structural formula (I) or (II):

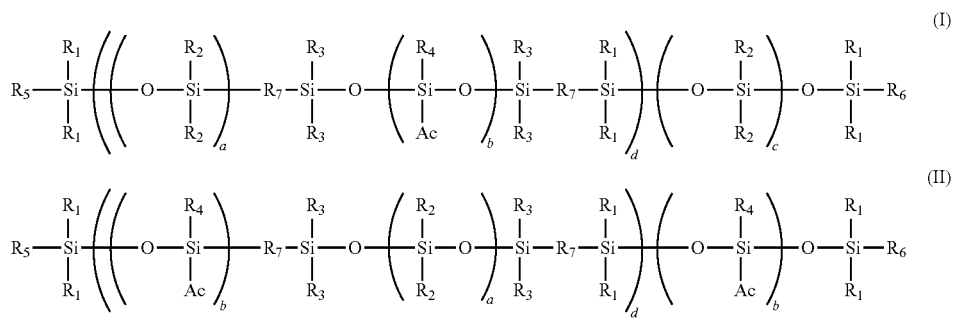

Wherein,

Ac represents a (meth)acryloxy (C3-C20)alkyl radical, $R_1$ to $R_4$, each independently, represent a substituted or unsubstituted (C1-C20)alkyl group, a substituted or unsubstituted (C6-C30)aryl group, a substituted or unsubstituted (C3-C30)cycloalkyl group, a substituted or unsubstituted (1- to 20-membered)heteroalkyl group, a substituted or unsubstituted (3- to 30-membered)heterocycloalkyl group, a substituted or unsubstituted (6- to 30-membered)heteroaryl group, or a substituted or unsubstituted (C6-C30)aryl(C1-C20)alkyl group, $R_5$ and $R_6$, each independently, comprise a substituted or unsubstituted (C2-C20)alkenyl group, hydrogen, hydroxyl, or a hydrolysable functional group at terminal, $R_7$ represents a substituted or unsubstituted (C2-C20) alkenyl group, each $R_1$ to $R_4$ and $R_7$ are the same or different from each other, a and c, each independently, represent an integer of 0 to 10,000, and b and d, each independently, represent an integer of 1 to 20.

Effects of Invention

The curable polyorganosiloxane composition according to the present disclosure may produce the cured body having ease of synthesis, low volatile content, excellent curability, excellent toughness, and/or superior optical/physical stability, and thus the curable polyorganosiloxane composition according to the present disclosure may be usefully applied in a variety of fields such as coating materials, encapsulants, sealants and adhesives.

DETAILED DESCRIPTION OF THE INVENTION

Hereinafter, exemplary embodiments of the present disclosure will be described in detail. The exemplary embodiments serve as examples embodied for describing the present invention without being limited to the scope of the present invention.

As used herein, when a specific definition is not otherwise provided, the term "substituted" means that a hydrogen atom in a certain functional group is replaced with another atom or another functional group, i.e. a substituent. The another atom or the substituent may be deuterium, a halogen (F, Cl, Br, I), a cyano group, a carboxyl group, a nitro group, a hydroxyl group, an imino group, an azido group, an amidino group, a hydrazino group, a hydrazono group, a carbonyl group, a carbamyl group, a mercapto group (a thiol group), an ester group, an ether group, a sulfonic acid group, a phosphoric acid group, a (C1-C30)alkyl group, a halo(C1-C30)alkyl group, a (C2-C30)alkenyl group, a (C2-C30)alkynyl group, a (C1-C30)alkoxy group, a (C1-C30)alkylthio group, a (C3-C30)cycloalkyl group, a (C3-C30)cycloalkenyl group, a (3- to 7-membered)heterocycloalkyl group, a (C6-C30)aryloxy group, a (C6-C30)arylthio group, a (5- to 30-membered)heteroaryl group, a (C6-C30)aryl group, a tri(C1-C30)alkylsilyl group, a tri(C6-C30)arylsilyl group, a di(C1-C30)alkyl(C6-C30)arylsilyl group, a (C1-C30)alkyldi(C6-C30)arylsilyl group, an amino group, a mono- or di-(C1-C30)alkylamino group, a mono- or di-(C6-C30)arylamino group, a (C1-C30)alkyl(C6-C30)arylamino group, a (C1-C30)alkylcarbonyl group, a (C1-C30)alkoxycarbonyl group, a (C6-C30)arylcarbonyl group, a di(C6-C30)arylboronyl group, a di(C1-C30)alkylboronyl group, a (C1-C30)alkyl(C6-C30)arylboronyl group, a (C6-C30)aryl (C1-C30)alkyl group, a (C1-C30)alkyl(C6-C30)aryl group, or a combination thereof.

As used herein, when a specific definition is not otherwise provided, the term "hetero" refers to at least one heteroatom selected from B, N, O, S, Si and P being contained in a chemical structure.

The present disclosure relates to a curable composition comprising the siloxane-based polymer having pendant (meth)acrylic functional group. The curable composition is characterized in comprising a siloxane-co-polymer backbone, consisting of polysiloxane units and sil-alkylene units formed by hydrosilylation reaction in the same molecule, not organopolysiloxane backbone. Also, the siloxane-based polymer is characterized in that a (meth)acrylic functional group is regularly distributed in pendant chains of the siloxane-based co-polymer backbone.

As used herein, the term "curable" composition refers to a composition that may be cured by at least one of light, heat, moisture and other factors. For example, the curable composition may be cured by only light, by both light and heat, by both light and moisture, or all of light, heat and moisture.

According to one embodiment of the present disclosure, the curable composition may include a siloxane-based polymer having a (meth)acryl functional siloxane segment (repeat unit) and a methylsiloxane (or phenylsiloxane, methylphenylsiloxane) segment, and an alkenyl, hydrogen (or alkoxy, hydroxy) functional group at terminal. The polymer structure is not limited to linear, resinous, circular, or branched polymer having Si-bonded (meth)acryloxy (C3-C20)alkyl radical group, and having polysiloxane units and sil-alkylene units formed by hydrosilylation reaction in the same molecule. Such siloxane-based polymer can be obtained by hydrosilylation reaction between the following combinations (i) or (ii):

(i) siloxane compound having at least one Si-bonded (meth)acryloxy (C3-C20)alkyl radical group and at least two Si-bonded alkenyl group, and compound having at least two Si-bonded hydrogen atoms;

(ii) siloxane compound having at least one Si-bonded (meth)acryloxy (C3-C20)alkyl radical group and at least two Si-bonded hydrogen atoms, and compound having at least two groups including olefinic C=C double bond in the molecule.

Specifically, such component (A) may include a siloxane-based polymer obtained by hydrosilylation reaction between (a1) at least one compound selected from the group consisting of (a1-1) siloxane compound having at least one Si-bonded (meth)acryloxy (C3-C20)alkyl radical group and at least two Si-bonded hydrogen atoms, and (a1-2) 1,4-dimethylsilylbenzene(p-dimethylsilylbenzene), and (a2) vinyl-terminated dimethylsiloxane polymer or other liner polydiorganosiloxane compound having alkenyl group including C=C double bond at molecular terminals.

According to one embodiment of the present disclosure, the curable composition may include block-copolymers having a (meth)acryl functional siloxane segment (repeat unit) and a dimethylsiloxane (or phenylmethylsiloxane, diphenylsiloxane) segment, and an alkenyl (or alkoxy, hydroxy) functional group at terminal. The curable composition may be cured by means of a free radical mechanism of a (meth)acryl group. Also, the curable composition having the alkenyl group at terminal may be cured by hydrosilylation reaction of an alkenyl group. Further, the curable composition having either of an alkoxy or hydroxyl groups at terminal may be cured by moisture cure of these groups.

According to the first aspect of the present disclosure, the curable polyorganosiloxane composition may preferably comprise (A) a siloxane-based polymer represented by the following structural formula (I) or (II), and (B) a photoinitiator.

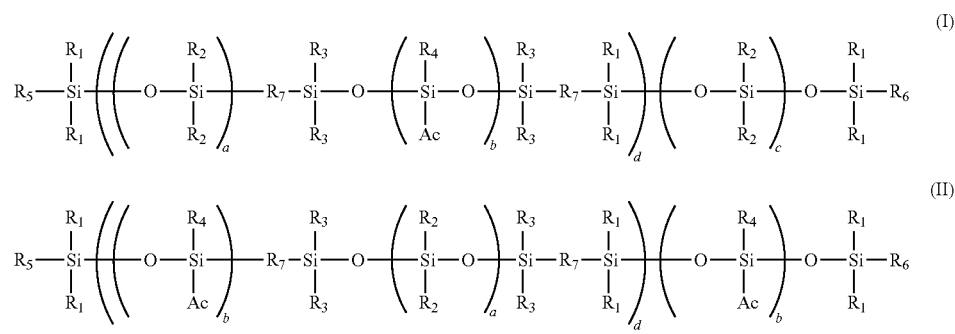

Herein, siloxane-based polymer represented by aforementioned formula (I) or (II) can be called as "poly(siloxane-silalkylene)block-copolymer."

In structural formula (I) or (II), Ac represents a (meth)acryloxy (C3-C20)alkyl radical. The (meth)acryloxyalkyl radical may be a self-curable group. For example, Ac may be methacryloxypropyl, methacryloxybutyl, methacryloxypentyl, acryloxypropyl, acryloxybutyl, acryloxypentyl, and etc.

In structural formula (I) or (II), $R_1$ to $R_4$, each independently, represent a substituted or unsubstituted (C1-C30)alkyl group, a substituted or unsubstituted (C6-C30)aryl group, a substituted or unsubstituted (C3-C30)cycloalkyl group, a substituted or unsubstituted (C1-C30)heteroalkyl group, a substituted or unsubstituted (C3-C30)heterocycloalkyl group, a substituted or unsubstituted (C6-C30)heteroaryl group, or a substituted or unsubstituted (C6-C30)aryl(C1-C30)alkyl group. According to one embodiment of the present disclosure, $R_1$ to $R_4$, each independently, may represent a substituted or unsubstituted (C1-C20)alkyl group, a substituted or unsubstituted (C6-C30)aryl group, a substituted or unsubstituted (C3-C30)cycloalkyl group, or a substituted or unsubstituted (C6-C30)aryl(C1-C20)alkyl group; or may represent an unsubstituted (C1-C10)alkyl group, or an unsubstituted (C6-C25)aryl group. Each of $R_1$, each of $R_2$, each of $R_3$, and each of $R_4$ may be the same or different from each other. For example, $R_1$ to $R_4$ may represent an unsubstituted methyl.

In structural formula (I) or (II), $R_5$ and $R_6$, each independently, may comprise at least one of a substituted or unsubstituted (C2-C20)alkenyl group, hydrogen, hydroxyl, and a hydrolysable functional group. $R_5$ and $R_6$ may be the same or different. $R_5$ and $R_6$ may comprise a substituted or unsubstituted (C2-C20)alkenyl group, or a hydrolysable functional group at terminal. According to one embodiment of the present disclosure, $R_5$ and $R_6$ may comprise a well-known substituent other than alkenyl groups and hydrolyzable functional groups, which may be suitable for providing light curable polyorganosiloxane compositions. According to another embodiment of the present disclosure, any one of $R_5$ and $R_6$ may comprise a substituted or unsubstituted (C2-C20)alkenyl group, hydroxyl, or a hydrolysable functional group, and the other of them may comprise a well-known substituent other than alkenyl groups, hydroxyl and hydrolyzable functional groups. According to another embodiment of the present disclosure, $R_5$ and $R_6$ may comprise at least one unsubstituted (C2-C20)alkenyl group at terminal. The alkenyl group-terminated siloxane-based polymer may be suitable for providing a light-heat dually curable polyorganosiloxane composition. Also, according to another embodiment of the present disclosure, $R_5$ and $R_6$ may comprise at least one hydroxyl or hydrolysable functional group at terminal. The hydroxyl or hydrolysable functional group-terminated siloxane-based polymer may be suitable for providing a light-moisture dually curable polyorganosiloxane composition. Further, according to another embodiment of the present disclosure, any one of $R_5$ and $R_6$ may comprise an unsubstituted (C2-C20)alkenyl group-terminal, and the other of them may comprise a hydroxyl or hydrolysable functional group-terminal, which may be suitable for providing a light-heat-moisture multiple curable polyorganosiloxane composition. According to another embodiment of the present disclosure, the hydrolysable functional group may comprise at least one of (C1-C30)alkoxy, which may produce an alkoxy-terminated siloxane-based polymer. For example, $R_5$ and $R_6$ may be vinyl, or are represented by the following structural formula III or IV:

  (III)

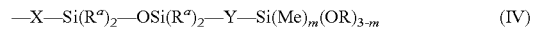  (IV)

wherein, X and Y represent linear or branched (C2-C6)alkylene group, Me represents methyl group, R represents a substituted or unsubstituted (C1-C20)alkyl group or a substituted or unsubstituted (C6-C30)aryl group, $R^a$ represents (C1-C6) alkyl group, m represents 0, 1 or 2; and $R_5$ and $R_6$ may be the same or different from each other. Furthermore, for $R_5$ and $R_6$ groups, preferred structures are following:

  (III')

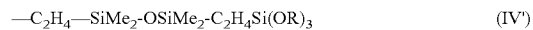  (IV')

Wherein R represents a substituted or unsubstituted (C1-C20)alkyl group or a substituted or unsubstituted (C6-C30)aryl group.

In structural formula (I) or (II), $R_7$ represents a substituted or unsubstituted (C2-C20)alkenyl group. According to one embodiment of the present disclosure, $R_7$ may represent an unsubstituted (C2-C10)alkenyl group. Each of $R_7$ may be the same or different from each other. For example, $R_7$ may represent an ethylene.

In structural formula (I) or (II), a and c, each independently, represent an integer of 0 to 10,000; preferably, an integer of 150 to 8,000; and more preferably, an integer of 150 to 5,000. In the siloxane-based polymer of the present disclosure, the length of the siloxane block may be critical to have the toughness of the cured polyorganosiloxane composition comprising it.

In structural formula (I), b represents an integer of 1 to 10; preferably, an integer of 1 to 6; and more preferably, an integer of 1 to 4. In structural formula (I), d represents an integer of 1 to 20; preferably, an integer of 2 to 10; and more preferably, an integer of 2 to 5. b refers to the number of methacryl groups, and when b is increased, the photocuring speed is improved. In particular, when the length of the siloxane block is long and the number of methacryl groups is small, the curability may be deteriorated. In order to overcome this problem, the number of adjacent methacryl groups may be increased to improve the curability. Also, at least one acryl siloxane unit, preferably at least two acryl siloxane units, may be disposed in a polymer to control the crosslinking speed as well as physical properties such as hardness and tensile properties after curing.

According to one embodiment of the present disclosure, the siloxane-based polymer may be as follows.

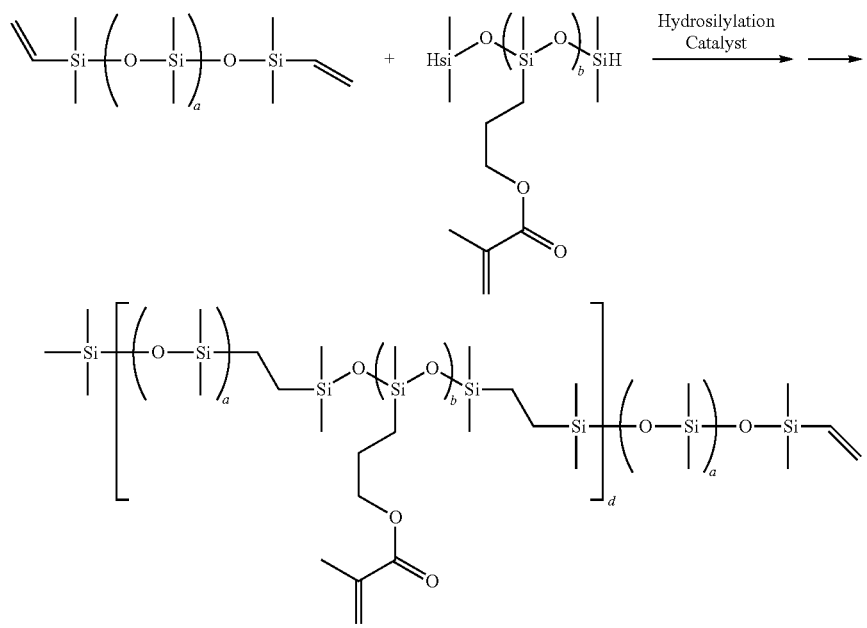

The siloxane-based polymer may be thermally cured by additional hydrosilylation reaction of the vinyl group at the terminal with an SiH crosslinker. Further, the terminated-vinyl group and a hydrolyzable substance (SiH substance containing a hydrolyzable functional group, for example, an alkoxy group) are hydrosilylated to have a hydrolyzable functional group at terminal, which may cause the siloxane-based polymer to be moisture-curable.

The curable polyorganosiloxane composition of the present disclosure have regularly distributed (meth)acrylic groups, which may be prepared via a hydrosilylation pathway between methacrylate having a SiH group (or alkenyl group) and a polysiloxane polymer having a vinyl group (or SiH group). As the (meth)acrylic functional groups are regularly distributed on the siloxane backbone, there is an effect of exhibiting excellent mechanical properties as well as efficient curing properties by UV light. As reported so far, the following method has been used to make a polyorganosiloxane polymer containing a (meth)acryl group. A (meth)acryloxyalkyl group-containing organopolysiloxane of a linear molecular structure is conventionally prepared by the ring-opening siloxane rearrangement polymerization reaction of a cyclic organopolysiloxane oligomer having (meth) acryloxyalkyl groups bonded to the silicon atoms either alone or as a mixture with another cyclic organopolysiloxane oligomer having no (meth)acryloxyalkyl groups in the presence of an acid as a catalyst followed by neutralization of the acidic catalyst with a basic compound. This method of acid-catalyzed polymerization reaction has some problems and disadvantages. For example, neutralization reaction of an acid with a basic compound is necessarily accompanied by the formation of water as a reaction product while water in the (meth)acryloxyalkyl group-containing organopolysiloxane acts as a hydrolyzing agent on the (meth)acrylic ester groups in the presence of an acidic or basic compound so as to cause a decrease in the effective content of the (meth)acryloxyalkyl groups as the functional groups in the organopolysiloxane product. Moreover, the aforementioned hydrolysis reaction of the ester groups eventually leads to the formation of microgels which cause a great decrease in the filtrability of the reaction product due to clogging of the filter paper or cloth when it is subjected to filtration to remove the salt formed by the neutralization reaction and other solid materials. In order to remove the cyclic impurity generated during the reaction, it is necessary to remove the volatile components by heating. However, since the (meth) acryl group can react thermally with each other, there are many restrictions on such a process. The polymer prepared by the above reported method is a random copolymer in which (meth) acryl groups are randomly distributed, and thus it is very difficult to implement uniform or suitable mechanical properties. For example, the physical properties after curing are likely to become brittle, that is, the brittleness may be high. Also, it is not desirable that the (meth)acrylic functional groups are located at the end of the siloxane backbone, since there is a problem that the curability against UV light is remarkably low.

According to a second aspect of the present disclosure, the curable polyorganosiloxane composition may comprise (A) a siloxane-based polymer represented by the structural formula (I) or (II), wherein $R_5$ and $R_6$ comprise at least one of a substituted or unsubstituted (C2-C20)alkenyl group; (B) a photoinitiator; (C) a crosslinking component; and (D) a hydrosilylation catalyst. According to one embodiment of the present disclosure, at least one of $R_5$ and $R_6$ comprises an unsubstituted (C2-C20)alkenyl group, for example, vinyl, allyl, butenyl, pentenyl, hexenyl, heptenyl, octenyl, nonenyl, decenyl, undecenyl, or dodecenyl, at terminal. The present disclosure may provide a light-heat dually curable polyorganosiloxane composition by containing an alkenyl-terminated siloxane-based polymer.

The siloxane-based polymer of the present disclosure may be prepared by comprising the steps of (i) preparing hydrogen containing (meth)acrylate intermediates for (meth)acryl repeat units; and (ii) hydrosilylation between vinyl-terminated siloxane and the intermediate by using a hydrosilylation catalyst. In the step of hydrosilylation, alkenyl-terminated or hydrogen-terminated siloxane polymer having a pendant (meth)acryl group is obtained by controlling the mole of silicon-bonded hydrogen atoms in the siloxane-based polymer divided by the mole of aliphatic unsaturated organic groups (SiH/Vi ratio) as no more than or no less than 1.0. This polymer may be useful for light curable compositions and/or light-heat dually curable compositions.

According to a third aspect of the present disclosure, the curable polyorganosiloxane composition may comprise (A) a siloxane-based polymer represented by the structural formula (I) or (II), wherein $R_5$ and $R_6$ comprise at least one of a hydrolysable functional group or hydroxy, and the hydrolysable functional group is represented by the following structural formula (III) or (IV); (B) a photoinitiator; (E) a hydrolysable crosslinker; and (F) a condensation cure catalyst. According to one embodiment of the present disclosure, at least one of $R_5$ and $R_6$ comprises a hydrolysable functional group or hydroxy at terminal. The present disclosure may provide a light-moisture dually curable polyorganosiloxane composition by containing a trialkoxy-terminated siloxane-based polymer.

$$—X—Si(Me)_m(OR)_{3-m} \qquad (III)$$

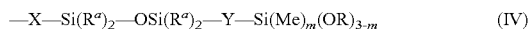
$$—X—Si(R^a)_2—OSi(R^a)_2—Y—Si(Me)_m(OR)_{3-m} \qquad (IV)$$

wherein, X and Y represent linear or branched (C2-C6) alkylene group, Me represents methyl group, R represents a substituted or unsubstituted (C1-C20)alkyl group or a substituted or unsubstituted (C6-C30)aryl group, $R^a$ represents (C1-C6) alkyl group, m represents 0, 1 or 2.

For the hydrolysable functional group represented by said structural formula (III) or (IV), preferred groups are represented by the following formula (III') or (IV'):

$$—C_2H_4—Si(OR)_3 \qquad (III')$$

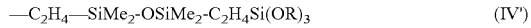
$$—C_2H_4—SiMe_2\text{-}OSiMe_2\text{-}C_2H_4Si(OR)_3 \qquad (IV')$$

Wherein, R represents a substituted or unsubstituted (C1-C20)alkyl group, or a substituted or unsubstituted (C6-C30) aryl group; as one embodiment, an unsubstituted (C1-C20) alkyl group; and for example, methyl, ethyl, propyl or butyl group.

According to one embodiment of the present disclosure, at least one of $R_5$ and $R_6$ comprises a hydrolysable functional group or hydroxy at terminal. The present disclosure may provide a light-moisture dually curable polyorganosiloxane composition by containing a trialkoxy-terminated siloxane-based polymer.

The siloxane-based polymer of the present disclosure may be prepared by comprising the steps of (i) preparing hydrogen (or alkenyl group) containing (meth)acrylate intermediates for (meth)acryl repeat units; (ii) hydrosilylation between vinyl-terminated siloxane and the intermediate by using a hydrosilylation catalyst; and (iii) further hydrosilylation by using SiH containing alkoxy silane or siloxane. Thereby, an alkoxy-terminal siloxane polymer containing pendant (meth)acryl group may be obtained. This polymer may be useful for light-moisture curable compositions. In the previous report of US Pat. Appl. Publication No. 20040116547A1, and U.S. Pat. Nos. 4,528,081 and 4,699, 802, a structure having both a methacrylic group and a mono- and di-alkoxy group at the terminal of the polysiloxane polymer is reported. However, the structure having a methacryl group in the side chain and a trialkoxy group at the terminal which is specifically disclosed in the present disclosure is very important to have excellent dual curing properties.

According to a fourth aspect of the present disclosure, the curable polyorganosiloxane composition may comprise (A) a siloxane-based polymer represented by the structural formula (I) or (II), wherein any one of $R_5$ and $R_6$ comprises a substituted or unsubstituted (C2-C20)alkenyl group at terminal, and the other of them comprises a hydrolysable functional group or hydroxy at terminal, and the hydrolysable functional group is represented by the structural formula (III) or (IV); (B) a photoinitiator; and at least one of (C) a crosslinking component, (D) a hydrosilylation catalyst, (E) a hydrolysable crosslinker and (F) a condensation cure catalyst. The present disclosure may provide a light-heat-moisture multiple curable polyorganosiloxane composition by containing a vinyl- and a trialkoxy-terminated siloxane-based polymer.

According to a fifth aspect of the present disclosure, the curable polyorganosiloxane composition according to any one of the first to fourth aspects, may further comprise at least one of (G) an acrylate monomer, (H) a silicone resin, (I) a filler, (J) a solvent and (K) a cure additive.

According to a sixth aspect of the present disclosure, a cured body obtained by curing the curable polyorganosiloxane composition according to any one of the first to fifth aspects may be provided. The cured body is obtained by curing the light curable (or light-heat dually curable, light-moisture dually curable, or light-heat-moisture multiple curable) polyorganosiloxane composition according to one embodiment of the present disclosure. The curing method of the light curable (or light-heat dually curable, light-moisture dually curable, or light-heat-moisture multiple curable) polyorganosiloxane composition is not particularly limited, but generally, rapidly curing the polyorganosiloxane composition by ultraviolet irradiation (or ultraviolet-heat, ultraviolet-moisture, ultraviolet-heat-moisture) to form a cured body. This cured body may exhibit excellent adhesion to the contacted substrate during curing and may exhibit good release by being able to be efficiently peeled from the substrate.

The cured body may be at least one selected from the group consisting of coating materials, encapsulants, sealants and adhesives. Also, the cured body does not cause cracking during curing, and may have quick curability, excellent toughness and/or good optical/physical stability.

According to a seventh aspect of the present disclosure, an electronic device comprising the cured body according to the sixth aspect may be provided.

The electronic device is not particularly limited, and examples thereof include a metal oxide film electrode or a metal electrode such as silver, copper, aluminum, gold, etc., on a substrate such as a glass, an epoxy resin, a polyimide resin, a phenol resin, and ceramic resin, etc. Examples of the electrodes include an electrode of liquid crystal displays (LCDs), flat panel displays (FPDs) and flat panel display devices. The polyorganosiloxane compositions according to one embodiment of the present disclosure may be used for coating electrodes. An electronic device according to one aspect of the present disclosure is capable of repairing and regenerating an electronic device due to the high adhesion to the substrate contacted during curing of the cured body of the present disclosure and the high release from the substrate.

According to an eighth aspect of the present disclosure, a manufacturing process of an electronic device by using the curable polyorganosiloxane composition according to any one of the first to fifth aspects may be provided.

The composition may be coated to electrodes, electrical circuits and substrates by the means of dispensing, slit-die, screen printing, spraying, roll-to-roll, dip coating, spin coating, etc., and the composition may be cured on the substrate by light irradiation. In the case of the dual curing composition, if there is a part or structure that does not transmit light well after the coating in the above-described manner, curing can be completed by heat or moisture.

According to a ninth aspect of the present disclosure, a manufacturing process of an electronic device comprising sealing the electronic device with the cured body obtained by curing the curable polyorganosiloxane composition according to the sixth aspect may be provided.

Hereinafter, each component of the curable polyorganosiloxane composition according to the above embodiment will be described in detail.

(B) Photoinitiator

Herein, the photoinitiator refers to a material which is excited by ultraviolet or visible light to initiate photo polymerization, or a material which causes photo polymerization with the aid of other sensitizers. The photoinitiator of the present disclosure is not limited to a photoinitiator and a photoinitiator aid, as long as it absorbs light in an ultraviolet or visible light zone, and radically polymerizes a photosensitive unsaturated double bond. The photoinitiator of the present disclosure may be a substance commonly used in the polyorganosiloxane composition. For example, the photoinitiator may comprise at least one selected from the group consisting of acetophenone-, benzophenone-, thioxanthone-, benzoin-, triazine-, oxime-, carbazole-, diketone-, sulfonium borate-, diazo-, imidazole- and biimidazole-based compounds.

According to one embodiment of the present disclosure, the photoinitiator may be one or a mixture of two or more selected from the group consisting of 2,2-dimethoxy-1,2-diphenylethane-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-{4-[4-(2-hydroxy-2-methyl-propionyl)-benzyl]phenyl}-2-methyl-propan-1-one, 2,4,6-trimethylbenzoyldiphenyl phosphine oxide, bis(2,4,6-trimethylbenzoyl)-phenyl phosphine oxide, etc. For example, the photoinitiator may be 2-hydroxy-2-methyl-1-phenyl-propan-1-one.

The content of the photoinitiator of the present disclosure may be appropriately selected as necessary, for example, about 0.01 to about 10 wt %, or about 0.1 to about 5 wt %, or about 0.1 to about 1 wt %, or about 0.2 to about 0.5 wt %, based on the total weight of the polyorganosiloxane composition. When the photoinitiator within the above range is comprised in the light curable polyorganosiloxane composition according to the exemplary, the photo polymerization may sufficiently take place at the time of exposure. Also, the reduction of transparency may be prevented because the photoinitiator, which may cause some failure in optical clearance, is consumed through the reaction at aforementioned content in the curable composition. Thus, the coating stability may be satisfied at the same time.

(C) Crosslinking Component

Herein, the crosslinking component for said component (A) comprises at least one selected from (c1) organohydrogenpolysiloxane having at least two Si-bonded hydrogen atoms or (c2) compound having at least two groups including olefinic C=C double bond. When component (A) has alkenyl groups, component (C) is preferred to comprise at least one (c1) organohydrogenpolysiloxane. On the other hand, when component (A) has Si-bonded hydrogen atoms, component (C) is preferred to comprise at least one (c2) compound having at least two groups including olefinic C=C double bond.

(c1): Organohydrogenpolysiloxane

Herein, the organohydrogenpolysiloxane has at least two silicon-bonded hydrogen atom per molecule, and may be a single hydrogen siloxane compound or a plurality of different hydrogen siloxane compounds. The structure of the hydrogen siloxane may be linear, branched, cyclic (e.g., cyclosiloxane), or resinous.

According to one embodiment of the present disclosure, the hydrogen siloxane may be polyorganohydrogen siloxane, which is exemplified by: dimethylhydrogensiloxy-terminated polydimethylsiloxane, dimethylhydrogensiloxy-terminated poly(dimethylsiloxane/methylhydrogensiloxane), dimethylhydrogensiloxy-terminated polymethylhydrogensiloxane, trimethylsiloxy-terminated poly(dimethylsiloxane/methylhydrogensiloxane), trimethylsiloxy-terminated polymethylhydrogensiloxane, a resin consisting essentially of $H(CH_3)_2SiO_{1/2}$ units and $SiO_{4/2}$ units, and a combination thereof.

Methods of preparing linear, branched, and cyclic organohydrogenpolysiloxanes suitable for use as ingredient (C), such as hydrolysis and condensation of organohalosilanes, are well-known in the art. Methods of preparing organohydrogenpolysiloxane resins suitable for use as ingredient (C) are also well known as exemplified in U.S. Pat. Nos. 5,310,843, 4,370,358, and 4,707,531.

(c2): Compound Having Unsaturated Olefinic Group

Herein, the compound having at least two groups including olefinic C=C double bond is exemplified as compound having alkenyl group or any other reactive group including olefinic C=C double bond, including unsaturated partial structure. Substantially, such compound may be vinyl diluent, vinyl polymer, vinyl resins having (C2-C12)alkenyl groups in the molecule. The compound may have polysiloxane backbone or non-silicone organic compound like hexadiene.

(D) Hydrosilylation Catalyst

Herein, the hydrosilylation catalyst means a reaction catalyst of hydrosilylation reaction which refers to an addition reaction between at least two compounds involving Si—H atom of one compound added to an unsaturated, C=C double bond of another compound. The hydrosilylation catalysts may comprise platinum group metals selected from platinum (Pt), rhodium, ruthenium, palladium, osmium and iridium metals, or organometallic compounds thereof, or combinations thereof. In addition, the hydrosilylation catalysts may be a compound such as chloroplatinic acid, chloroplatinic acid hexahydrate, platinum dichloride, and a complex of the compound with a low molecular weight organopolysiloxane, or a platinum compound microencapsulated in a matrix or core shell type structure. The hydrosilylation catalysts may be platinum and low molecular weight organopolysiloxane complexes, which may comprise platinum and 1,3-diethenyl-1,1,3,3-tetramethyldisiloxane complexes, and may further comprise the dimethylvinylsiloxy-terminated dimethylsiloxane and/or tetramethyl divinyl disiloxane.

The content of the hydrosilylation catalyst may be appropriately selected as necessary, for example, about 0.01 to about 1 wt %, or about 0.04 to about 0.5 wt %, or about 0.1 to about 0.4 wt %, based on the total weight of the polyorganosiloxane composition. If the content of the hydrosilylation catalyst is above the minimum value of the given range, the resulting composition can be quickly cured by heat. Also, if it is below the maximum value of the given range, the shelf life of the resulting composition may be improved.

(E) Hydrolysable Crosslinker

Herein, the hydrolysable crosslinker refers to a condensation reaction crosslinker, which is exemplified by: vinyltrichlorosilane, vinyltrimethoxysilane, vinyltriethoxysilane, β-(3,4-epoxycyclohexyl) ethyltrimethoxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, p-styryltrimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-(β-aminoethyl)-γ-aminopropylmethyldimethoxysilane, N-(β-aminoethyl)-γ-aminopropyltrimethoxysilane, N-(β-aminoethyl)-γ-aminopropyltriethoxysilane, γ-aminopropyltrimethoxysilane, γ-aminopropyltriethoxysilane, N-phenyl-γ-aminopropyltrimethoxysilane, N-2-(aminoethyl)-γ-aminopropyltriethoxysilane, γ-mercaptopropyltrimethoxysilane, γ-mercaptopropyltriethoxysilane, mercaptomethyltrimethoxysilane, dimethoxy-3-mercaptopropylmethylsilane, 2-(2-aminoethylthioethyl) diethoxymethylsilane, 3-(2-acetoxyethylthiopropyl) dimethoxymethylsilane, 2-(2-aminoethylthioethyl) triethoxysilane, dimethoxymethyl-3-(3-phenoxypropylthiopropyl) silane, bis (triethoxysilyl) disulfide, bis (triethoxysilylpropyl) tetrasulfide, 1,4-bis (triethoxysilyl) benzene, bis (triethoxysilyl) ethane, 1,6-bis (trimethoxysilyl) hexane, 1,8-bis (triethoxysilyl) octane, 1,2-bis (trimethoxysilyl) decane, bis (triethoxysilylpropyl) amine, bis (trimethoxysilylpropyl) urea, tris-(3-trimethoxysilylpropyl) isocyanurate, γ-chloropropyltrimethoxysilane, γ-ureidopropyltriethoxysilane, trimethylsilanol, diphenylsilanediol, triphenylsilanol, γ-triethoxysilylpropyl (meth) acrylate, hexyltrimethoxysilane, and a combination thereof.

According to one embodiment of the present disclosure, the hydrolysable crosslinker is at least one selected from the group consisting of vinyltrimethoxysilane, 1,6-bis (trimethoxysilyl)hexane, 1,8-bis(trimethoxysilyl)octane, γ-(meth)acryloxypropyltrimethoxysilane, and a combination thereof. According to another embodiment of the present disclosure, the hydrolysable crosslinker is vinyltrimethoxysilane available from Evonik under the trade name of Dynasylan VTMO.

The content of the hydrolysable crosslinker may be appropriately selected as necessary, for example, about 0.01 to about 10 wt %, or about 1 to about 5 wt %, or about 0.1 to about 3 wt %, based on the total weight of the polyorganosiloxane composition. When the hydrolyzable crosslinker in the above range is included in the light curable polyorganosiloxane composition according to one embodiment of the present invention, there is an advantage in that the storage stability and the mechanical strength may be maximized.

(F) Condensation Cure Catalyst

The condensation cure catalyst of the present disclosure refers to a compound which initiates the moisture curing of the composition in the presence of moisture, and includes those known to be useful for facilitating moisture curing. The catalysts include metal and non-metal catalysts. Examples of the metal portion of the metal catalysts useful in the present invention include tin, titanium, zirconium, lead, iron, cobalt, antimony, manganese, bismuth and/or zinc compounds.

In one embodiment, the tin compounds useful for facilitating the moisture curing of the composition include but are not limited to dimethyl dineodecanoate tin (available from Momentive Performance Materials Inc. under the trade name of FOMRE Z UL-28 A), dibutyltindilaurate, dibutyltindiacetate, dibutyltindimethoxide, tinoctoate, isobutyltint riceroate, dibutyltinoxide, solubilized dibutyl tin oxide, dibutyltin bis diisooctylphthalate, bis-tripropoxysilyl dioctyltin, dibutyltin bis-acetylacetone, silylated dibutyltin dioxide, carbomethoxyphenyl tin tris-uberate, isobutyltin triceroate, dimethyltin dibutyrate, dimethyltin di-neodecanoate, triethyltin tartarate, dibutyltin dibenzoate, tin oleate, tin naphthenate, butyltin tri-2-ethylhexylhexoate, tin-butyrate, dioctyltin didecylmercaptide, bis (neodecanoyloxy) dioctylstannane, dimethylbis (oleoyloxy) stannane, and a combination thereof.

In one preferred embodiment, the condensation cure catalyst is selected from the group consisting of dimethyldineodecanoate tin (available from Momentive Performance Materials Inc. under the trade name of FOMRE Z UL-28, dioctyltin didecylmercaptide (available from Momentive Performance Materials Inc. under the trade name of FOMREZ UL-32), bis (neodecanoyloxy) dioctylstannane (available from Momentive Performance Materials Inc. under the trade name of FOMREZ UL-38), dimethylbis (oleoyloxy) stannane (available from Momentive Performance Materials Inc. under the trade name of FOMREZ UL-50), and a combination thereof. For example, the condensation cure catalyst is dimethyldineodecanoate tin.

The content of the condensation cure catalyst may be appropriately selected as necessary, for example, about 0.001 to about 10 wt %, or about 0.1 to about 0.5 wt %, or about 0.1 to about 0.3 wt %, based on the total weight of the polyorganosiloxane composition. If the content of the condensation cure catalyst is above the minimum value of the given range, the resulting composition can be quickly cured by moisture in the air. Also, if it is below the maximum value of the given range, the shelf life of the resulting composition may be improved.

(G) Acrylate Monomer

Herein, the acrylate monomer may be at least one selected from the group consisting of ethyl(meth)acrylate, n-propyl (meth)acrylate, isopropyl(meth)acrylate, n-butyl(meth)acrylate, t-butyl(meth)acrylate, sec-butyl(meth)acrylate, pentyl (meth)acrylate, 2-ethylhexyl(meth)acrylate, n-octyl(meth) acrylate, isooctyl(meth)acrylate, isononyl(meth)acrylate, lauryl(meth)acrylate, tetradecyl(meth)acrylate and isostearyl(meth)acrylate. The content of the acrylate monomer may be appropriately selected as necessary, for example, about 1 to about 50 wt %, or about 1 to about 20 wt %, based on the total weight of the polyorganosiloxane composition.

(H) Silicone Resin

Herein, the silicone resin may comprise at least one MQ resin, and the MQ resin may comprise a MDT resin and/or an MDQ structure. The MQ resin is a macromolecular polymer primarily consisting of $R^1_3SiO_{1/2}$ and $SiO_{4/2}$ units (M and Q units, respectively), wherein $R^1$ represents a functional or non-functional, substituted or unsubstituted monovalent radical, and for example, may be methyl or phenyl. "MQ resin" in the present disclosure refers to that only about 20 mole % or less of resin molecules averagely consist of D and T units, wherein D and T units represent $R^1_2SiO_{2/2}$ and $R^1SiO_{3/2}$ units, respectively. The content of the silicone resin may be appropriately selected as necessary, for example, about 1 to about 70 wt %, or about 1 to about 60 wt %, or about 1 to about 50 wt %, based on the total weight of the polyorganosiloxane composition.

(I) Filler

Herein, the filler may be reinforcing fillers, photopolymerization inhibitors, pigments, and combinations thereof. The filler is intended to impart mechanical strength to the cured body obtained by curing the polyorganosiloxane composition of the present disclosure and to improve release from the substrate. For example, the filler may comprise a fumed silica or alumina fine powder, a precipitated silica or alumina fine powder, a fused silica or alumina fine powder, a baked silica or alumina fine powder, a fumed titanium oxide fine powder, glass fiber, and a hydrophobized fine powder obtained by surface treatment of the aforementioned fine powders with an organosilane, silazane, and siloxane oligomer. The particle diameter of the fine powder may be suitably selected as necessary, and for example, the median diameter according to the assay using the laser diffraction/scattering type particle size distribution may range from about 0.01 micrometer to about 1,000 micrometers. The content of the filler may be appropriately selected as necessary, for example, about 0.01 to about 50 wt %, based on the total weight of the polyorganosiloxane composition.

(J) Solvent

Herein, the solvent may comprise an organic solvent or a non-crosslinkable silicone solvent. The organic solvent may be, for example, an alcohol such as toluene, xylene, acetone, methylethylketone, methylisobutylketone, hexane, heptane, decyl alcohol or undecyl alcohol, and combinations thereof. The non-crosslinkable silicone solvent may be, for example, a trimethylsiloxy-terminated polydimethylsiloxane, a trimethylsiloxy-terminated polymethylphenylsiloxane, and combinations thereof. The content of the solvent may be appropriately selected as necessary, for example, about 0.001 to about 90 wt %, based on the total weight of the polyorganosiloxane composition.

(K) Cure Additive

Herein, the cure additive may comprise at least one selected from the group consisting of a hydrogen donor, a reducing agent, a $CO_2$ producer, a singlet oxygen scavenger, and a N-vinyl amide. It is well-known in HUSÁR, Branislav, et al. The Formulator's Guide to Anti-Oxygen Inhibition Additives. *Progress in Organic Coatings*, 2014, 77.11: 1789-1798. For example, the hydrogen donor may be at least one selected from N-methyl diethanolamine (MDEA), 1,4-diazabicyclo[2.2.2]octane (DABCO), tribenzyl amine (Bz3N; 99%, Fluka), pentaery-thritol tetrakis(3-mercaptopropionate) (PETMP; Bruno Bock), trimethylolpropane tris (3-mercaptopropionate) (TMPMP; Bruno Bock), dioleyl hydrogen phosphite (D253; Dover), tris(trimethyl silyl) silane (TTMSS; 97%, ABCR), tri-n-butylstannane (Bu3SnH; 97%, Aldrich), and 4-anisaldehyde (PAA; 98%, Aldrich). For example, the reducing agent may be at least one selected from triphenyl phosphine (PPh3; 95%, Sigma-Aldrich), triphenyl phosphite (P(OPh)3; 97%, Fluka), tris (tridecyl) phosphite (D49; Dover), trioctyl phosphine (TOP; 90%, Fluka), poly(dipropyleneglycol) phenyl phosphite (D12; Dover), tetraphenyl dipropyleneglycol diphosphite (D11; Dover), bisphenol A phosphite (D613; Dover), 3,9-bis(octadecyloxy)-2,4,8,10-tetraoxa-3,9-diphosphaspiro [5.5]undecane (BOTDBU; Sigma-Aldrich), ethylene sulphite (ETS; 99%, Fluka) and dimethylamine-borane complex (Me2NH.BH3; 97%, Aldrich). For example, the singlet oxygen scavenger may be at least one selected from 2,5-diphenyl furan (DPF; 98%, Alfa Aesar) and 9,10-dibutyl anthracene (DBA). For example, $CO_2$ producers may be at least one selected from N-phenyl glycine (NPG; 93%, Acros), N-methyl-N-phenyl glycine (NMNPG), phenylthioacetic acid (PTAA; 96%, Aldrich), O-benzoyloximebenzaldehyde (POE) and 1-phenyl-1,2-propanedione-2-(O-ethoxycarboxy)oxime (PDO; Lambson). For example, N-vinyl amide may be at least one selected from N-vinyl pyrrolidone (NVP; 98%, Merck) and N-methyl pyrrolidone (NMP; Merck). The content of the cure additive may be appropriately selected as necessary, for example, about 0.001 to about 5 wt %, based on the total weight of the polyorganosiloxane composition.

In addition, the curable polyorganosiloxane composition of the present disclosure may add a certain amount of other additives such as an antioxidant, an ultraviolet absorber, a plasticizer, an adhesion promoter, a photosensitizer, a surfactant and the like, within a range that does not impair the physical properties. However, the additive may be used selectively (or restrictedly) in the presence of heat or moisture curing interferences in the light-heat or light-moisture dually curable compositions.

The curable polyorganosiloxane compositions of the present disclosure may comprise any combination of the above components. For example, the polyorganosiloxane composition of the present disclosure may be prepared by reacting components (A) and (B), or components (A) to (D), or components (A), (B), (E) and (F), or components (A) to (F), if necessary, at least one of the components (G) to (K), by homogeneously mixing them. The mixing method of the above components may be a conventionally known method and is not particularly limited, but may be generally uniform mixing by simple stirring. In addition, when a solid component such as an inorganic filler or the like is contained as an optional component, the mixture using a mixing device may be more preferable. Such a mixing device is not particularly limited, but may be, for example, a single or twin continuous mixer, a twin roller, a Ross mixer, a Hobart mixer, a dental mixer, a planetary mixer, Mixer, Henschel mixer, and the like. The mixture prepared in the aforementioned method may be stored for a long period of time by sealing in an airtight container under moisture barrier.

Hereinafter, the preparation method and properties of the siloxane-based polymer of the present disclosure will be explained in detail with reference to the representative compounds of the present disclosure, but is not limited by the following examples.

[Synthetic Example 1] Preparation of Copolymer A-1

A 500 mL of four necked flask equipped with a graham condenser and a thermometer was charged with 137.2 g of SiH-containing methacrylate ester (I) [$M_H D'M_{H'}$, wherein D' is Methacrylpropyl] (SiH-containing methacrylate esters may be prepared by referring to U.S. Pat. No. 6,417,309) and 6,862.8 g of vi-terminated dimethyl siloxane (DP: 139, Viscosity: 500 cP, Vi %: 0.44), and the mixture was mixed by a stirrer for 30 minutes. A platinum catalyst (2 ppm) was then added, and gradually the reaction temperature increases to 80° C. to perform a hydrosilylation reaction. After 2 hours, diallylmaleate was added to quench the reaction. Finally, a vinyl-terminated prepolymer having a pendant methacrylate group was obtained (Viscosity: 7200 cP, Mw: 62,447, vinyl %: 0.11, methacrylpropyl %: 0.88), which corresponds to the following copolymer A-1.

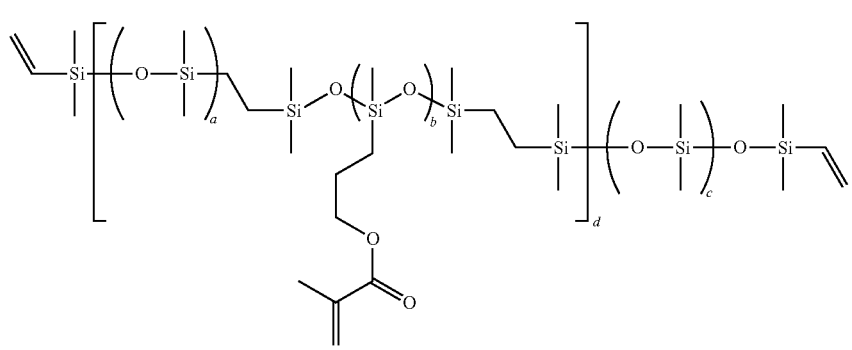

Copolymer A-1

Wherein, a represents 139, b represents 1, d represents 3, and c represents 139.

[Synthetic Example 2] Preparation of Copolymer A-2

A 500 mL of four necked flask equipped with a graham condenser and a thermometer was charged with 72.5 g of the above obtained SiH-containing methacrylate ester (I) [$M_H D'M_H$, wherein D' is Methacrylpropyl] and 6,862.8 g of vi-terminated dimethylsiloxane (DP: 290, Viscosity: 2,100 cP, Vi %: 0.22), and the mixture was mixed by a stirrer for 30 minutes. A platinum catalyst (2 ppm) was then added, and gradually the reaction temperature increases to 80° C. to perform hydrosilylation reaction. After 2 hours, diallyl-maleate was added to quench the reaction. Finally, a vinyl-terminated prepolymer having a pendant methacrylate group was obtained (Viscosity: 27,210 cP, MW: 118,753, vinyl %: 0.05, methacrylpropyl %: 0.46), which corresponds to the following copolymer A-2.

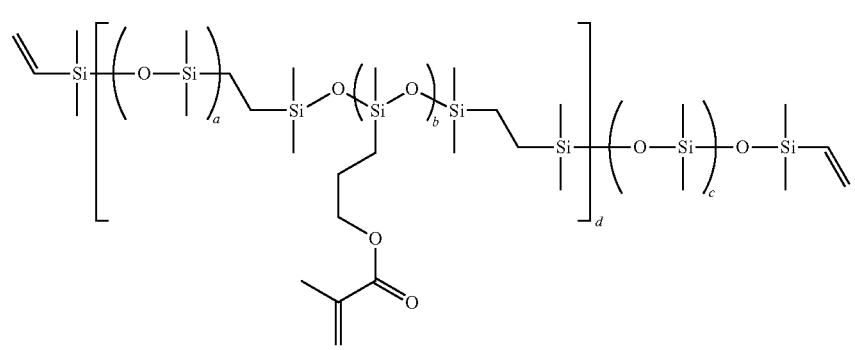

Copolymer A-2

Wherein, a represents 290, b represents 1, d represents 3, and c represents 290.

[Synthetic Example 3] Preparation of Copolymer A-3

A 500 mL of four necked flask equipped with a graham condenser and a thermometer was charged with 111.35 g of the above obtained SiH-containing methacrylate ester (I) [$M_H D'nM_H$, wherein D' is Methacrylpropyl, and n is 2 or 3] (SiH-containing methacrylate esters may be prepared by referring to U.S. Pat. No. 6,417,309), and 6,438.65 g of Vi-terminated dimethylsiloxane (DP: 290, Viscosity: 2,100 cP, Vi %: 0.22), and the mixture was mixed by a stirrer for 30 minutes (SiH/Vi ratio: 0.75). A platinum catalyst (2 ppm) was then added, and gradually the reaction temperature increases to 80° C. to perform hydrosilylation reaction. After 2 hours, diallylmaleate was added to quench the reaction. Finally, a vinyl-terminated prepolymer having a pendant methacrylate group was obtained (Viscosity: 2,400 cP, MW: 985,253, vinyl %: 0.06, methacrylpropyl %: 0.89), which corresponds to the following copolymer A-3.

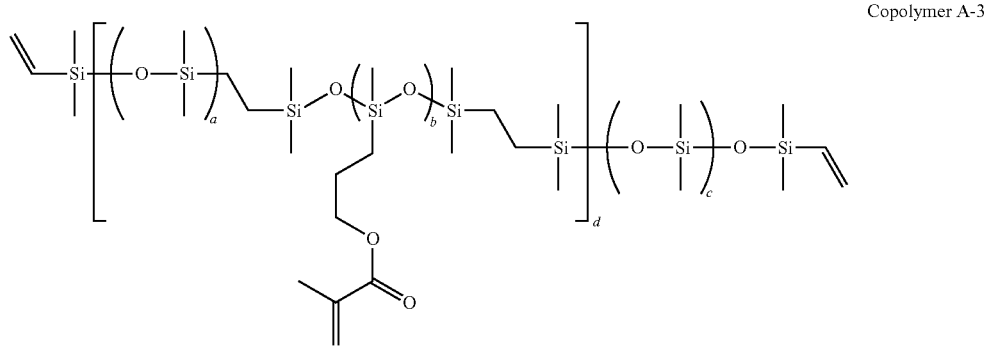

Copolymer A-3

Wherein, a represents 290, b represents 2 or 3, d represents 3, and c represents 290.

[Synthetic Example 4] Preparation of Copolymer A-4

A 500 mL of four necked flask equipped with a graham condenser and a thermometer was charged with 139.3 g of polyorganosiloxane A-1 which is obtained by the Synthetic Example 1 above and 0.67 g of trimethoxysilane, and the mixture was mixed by stirrer for 30 minutes. A platinum catalyst (2 ppm) was then added, and gradually the reaction temperature increases to 80° C. to perform hydrosilylation reaction. After 2 hours, diallylmaleate was added to quench the reaction. Finally, a trimethoxy-terminated polyorganosiloxane having a pendant methacrylate group was obtained (Viscosity: 21,954 cP, MW: 62,447, trimethoxysilyl %: 0.36, methacryl %: 0.87), which corresponds to the following copolymer A-4.

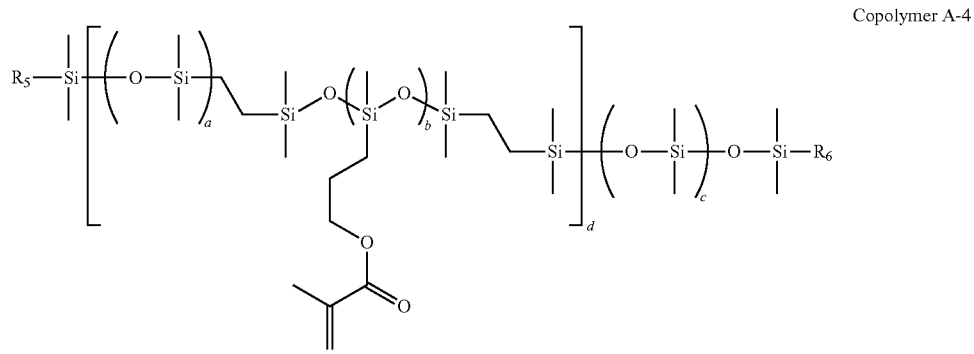

Copolymer A-4

Wherein, a represents 139, b represents 1, d represents 3, c represents 139, and both $R_5$ and $R_6$ represent —$C_2H_4$—Si(OMe)$_3$.

EXAMPLES

Hereinafter, the properties of the curable polyorganosiloxane composition according to one embodiment of the present disclosure will be explained in detail, but are not limited by the following examples.

[Example 1] Producing a Light Curable Polyorganosiloxane Composition

In Examples 1-1 to 1-5, the compounds shown in the following Table 1 were added to a dental mixer in the indicated weight %, and stirred at room temperature to produce a light curable polyorganosiloxane composition.

TABLE 1

| Component | Chemical Name | Example 1-1 | Example 1-2 | Example 1-3 | Example 1-4 | Example 1-5 |
|---|---|---|---|---|---|---|
| (A) Siloxane-based polymer | Copolymer A-1 | 99.5 | 44.4 | — | — | — |
| | Copolymer A-2 | — | — | 99.5 | 47.5 | — |
| | Copolymer A-3 | — | — | — | — | 49.5 |

TABLE 1-continued

| Component | Chemical Name | Example 1-1 | Example 1-2 | Example 1-3 | Example 1-4 | Example 1-5 |
|---|---|---|---|---|---|---|
| (B) Photoinitiator | IRGACURE ® 1173 | 0.5 | 0.5 | 0.5 | 0.5 | 0.75 |
| (G) Acrylate monomer | Lauryl Acrylate | — | 5.0 | — | 10.0 | 10.0 |
| (H) Silicone Resin | MQ Resin | — | 50.1 | — | 42.0 | 40.0 |

(Unit: weight %)

The viscosity, hardness and tensile were measured by the following methods for each light curable polyorganosiloxane composition produced in Examples 1-1 to 1-5, and the results thereof are shown in Table 2 below. Also, UV curing was performed by the Metalhalide D-bulb, 4000 mW/cm².

Viscosity

Herein, by using a rotational viscometer (HADV-III) (manufactured by Brookfield), a viscosity at 23° C. was measured using 52 # spindle.

Transmittance

Herein, a transmittance in the visible region wavelength (360 to 780 nm) at 23° C. was measured by a spectrophotometer (CM-3600 manufactured by Minolta Co., Ltd.) by filling a liquid state material in a quartz cell with a thickness of 10 mm.

Hardness

Herein, according to ASTM D 2240, 00 hardness of the cured product at 23° C. was measured by DUROMETER HARDNESS TYPE 00 (manufactured by ASKER). Regarding the cure condition, UV curing was performed by UV irradiation of 4000 mJ/cm², heat curing was performed by heat cure during 1 hour at 80° C., and moisture curing was performed by storing for 7 days at room temperature.

Tensile

Herein, according to JIS K 6301, elongation of the cured product at 23° C. was measured by using a Schopper tensile tester (manufactured by Toyo Seiki Seisaku-sho Ltd.).

TABLE 2

| Test Item | Example 1-1 | Example 1-2 | Example 1-3 | Example 1-4 | Example 1-5 |
|---|---|---|---|---|---|
| Viscosity [cP] | 7200 | 3950 | 27125 | 4800 | 4300 |
| Transmittance [%] | 99 | 98 | 99 | 98 | 97 |
| Hardness | 23 | 32 | 21 | 29 | 41 |
| Elongation [%] | 340 | 319 | 522 | 543 | 462 |

[Example 2] Producing a Light-Heat Dually Curable Polyorganosiloxane

Composition

In Examples 2-1 to 2-4, the compounds shown in the following Table 3 were added to a dental mixer in the indicated weight %, and stirred at room temperature to produce a light-heat dually curable polyorganosiloxane composition.

TABLE 3

| Component | Chemical Name | Example 2-1 | Example 2-2 | Example 2-3 | Example 2-4 |
|---|---|---|---|---|---|
| (A) Siloxane-based polymer | Copolymer A-1 | 52.6 | 50.9 | 62.8 | — |
| | Copolymer A-2 | — | — | — | 65.7 |
| (B) Photo-initiator | IRGACURE ® 184 | 0.5 | 0.5 | 0.5 | 0.5 |
| (C) Cross-linking component | Hydrogen-terminated dimethylpolysiloxane (5 cst) | 5.2 | 5.2 | 5.2 | 5.2 |
| | Trimethylsilyl-terminated methylhydrogen polysiloxane (20 cst) | 0.4 | 1.1 | 0.5 | 0.6 |
| (D) Hydro-silylation catalyst | Platinum catalyst | 0.002 | 0.002 | 0.002 | 0.002 |
| (G) Acrylate monomer | Isononyl Acrylate | 0.0 | 1.0 | 3.0 | 3.0 |
| (H) Silicone resin | MQ resin | 41.3 | 41.3 | 28.0 | 25.0 |

The viscosity, hardness and tensile were measured by the methods shown in Example 1 above for the light-heat dually curable polyorganosiloxane composition produced in Examples 2-1 to 2-4, and the results thereof are shown in Table 4 below.

TABLE 4

| Test Item | Example 2-1 | Example 2-2 | Example 2-3 | Example 2-4 |
|---|---|---|---|---|
| Viscosity [cP] | 9000 | 7900 | 5500 | 14500 |
| Transmittance [%] | 99 | 98 | 98 | 98 |
| Hardness (by UV) | 32 | 31 | 29 | 22 |
| Hardness (by heat) | 5 | 11 | 19 | 12 |
| Hardness (by UV and heat) | 43 | 51 | 64 | 34 |
| Elongation [%] | 342 | 298 | 321 | 572 |

[Example 3] Producing a Light-Moisture Dually Curable Polyorganosiloxane Composition In Examples 3-1 and 3-2, the compounds shown in the following Table 5 were added to a dental mixer in the indicated weight %, and stirred at room temperature to produce a light-moisture dually curable polyorganosiloxane composition.

TABLE 5

| Component | Chemical Name | Example 3-1 | Example 3-2 |
|---|---|---|---|
| (A) Siloxane-based polymer | Copolymer A-4 | 95.8 | 64.8 |

TABLE 5-continued

| Component | Chemical Name | Example 3-1 | Example 3-2 |
|---|---|---|---|
| (B) Photoinitiator | IRGACURE ® 1173 | 0.8 | 0.8 |
| (E) Hydrolysable crosslinker | MTM (methyltrimethoxysilane) | 3.0 | 3.0 |
| (F) Condensation cure catalyst | TnBT (tetra(n-butyl)titanate) | 1.0 | 1.0 |
| (H) Silicone resin | | — | 31.0 |

The viscosity, hardness and tensile were measured by the methods shown in Example 1 above for the light-moisture dually curable polyorganosiloxane composition prepared in Examples 3-1 and 3-2, and the results thereof are shown in Table 6 below.

TABLE 6

| Test Item | Example 3-1 | Example 3-2 |
|---|---|---|
| Viscosity [cP] | 5700 | 7200 |
| Hardness (by UV) | 23 | 22 |
| Hardness (by Moisture) | 24 | 28 |
| Hardness (by UV and Moisture) | 42 | 48 |
| Elongation [%] | 423 | 524 |

From the Examples above, it may be confirmed that the curable polyorganosiloxane composition according to the present disclosure may exhibit hardness, tensile strength, and good adhesion in view of elongation, and as a result, the cured body obtained by curing the curable polyorganosiloxane composition according to the present disclosure may exhibit excellent optical/physical properties.

Many modifications and other embodiments of the invention will come to mind to one skilled in the art to which this invention pertains, having the benefit of the teachings presented in the foregoing description. Accordingly, it is to be understood that the invention is not to be limited to the specific embodiments disclosed and that modifications and other embodiments are intended to be included within the scope of the appended claims.

The invention claimed is:

1. A curable polyorganosiloxane composition comprising:
(A) a siloxane-based polymer having at least one Si-bonded (meth)acryloxy C3-C20 alkyl radical group, and having polysiloxane units and sil-alkylene units formed by hydrosilylation reaction in the same molecule; and
(B) a photoinitiator;

wherein component (A) is a siloxane-based polymer obtained by hydrosilylation reaction from the following combinations (i) or (ii):

(i) a siloxane compound having at least one Si-bonded (meth)acryloxy C3-C20 alkyl radical group and at least two Si-bonded alkenyl groups, and a compound having at least two Si-bonded hydrogen atoms;

(ii) a siloxane compound having at least one Si-bonded (meth)acryloxy C3-C20 alkyl radical group and at least two Si-bonded hydrogen atoms, and a compound having at least two groups including an olefinic C═C double bond in the molecule.

2. The curable polyorganosiloxane composition according to claim 1, wherein component (A) is a siloxane-based polymer obtained by hydrosilylation reaction from the compounds of combination (ii).

3. The curable polyorganosiloxane composition according to claim 1, wherein component (A) is represented by the following structural formula (I) or (II):

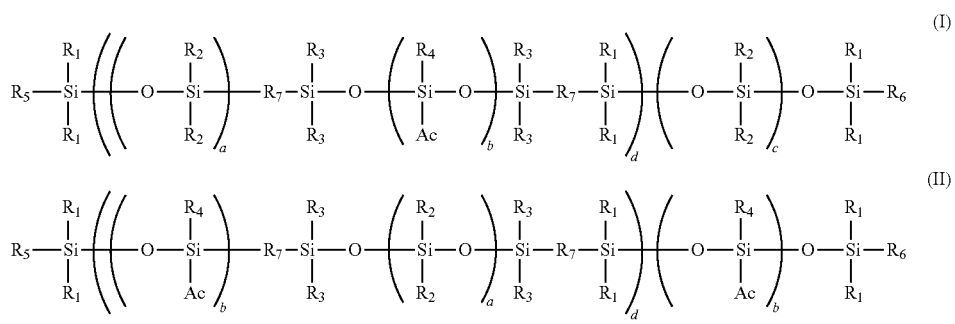

wherein,
Ac represents a (meth)acryloxy C3-C20 alkyl radical,
$R_1$ to $R_4$, each independently, represent a substituted or unsubstituted C1-C20 alkyl group, a substituted or unsubstituted C6-C30 aryl group, a substituted or unsubstituted C3-C30 cycloalkyl group, a substituted or unsubstituted 1- to 20-membered heteroalkyl group, a substituted or unsubstituted 3- to 30-membered heterocycloalkyl group, a substituted or unsubstituted 6- to 30-membered heteroaryl group, or a substituted or unsubstituted C6-C30 aryl C1-C20 alkyl group,
$R_5$ and $R_6$, each independently, comprise a substituted or unsubstituted C2-C20 alkenyl group, hydrogen, hydroxy, or a hydrolysable functional group at each terminal,
$R_7$ represents a substituted or unsubstituted C2-C20 alkylene group,
each $R_1$ to $R_4$ and $R_7$ are the same or different from each other,
a and c, each independently, represent an integer of 0 to 10,000, and
b and d, each independently, represent an integer of 1 to 20.

4. The curable polyorganosiloxane composition according to claim 3, wherein component (A) is the siloxane-based polymer, in which $R_5$ and $R_6$ in the structural formula (I) or (II) are the same group comprising a C2-C20 alkenyl group or a hydrogen atom at each terminal, and further comprising:
- (C) a crosslinking component for component (A), which comprises at least one cross-linker selected from (c1) an organohydrogenpolysiloxane having at least two Si-bonded hydrogen atoms and (c2) a compound having at least two groups including olefinic C=C double bond; and
- (D) a hydrosilylation catalyst.

5. The curable polyorganosiloxane composition according to claim 4, wherein component (D) comprises a platinum group metal, an organometallic compound thereof, or a mixture thereof.

6. The curable polyorganosiloxane composition according to claim 3, wherein component (A) is the siloxane-based polymer, in which $R_5$ and $R_6$ in the structural formula (I) or (II), each independently, comprise a hydroxy or hydrolysable functional group at each terminal, and the hydrolysable functional group is represented by the following structural formula (III) or (IV):

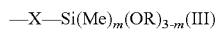—X—Si(Me)$_m$(OR)$_{3-m}$(III)

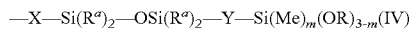—X—Si(R$^a$)$_2$—OSi(R$^a$)$_2$—Y—Si(Me)$_m$(OR)$_{3-m}$(IV)

wherein, X and Y independently represent a linear or branched C2-C6 alkylene group, Me represents methyl group, R represents a substituted or unsubstituted C1-C20 alkyl group or a substituted or unsubstituted C6-C30 aryl group, R$^a$ represents a C1-C6 alkyl group, m represents 0, 1 or 2; and further comprising:
at least one of (E) a hydrolysable crosslinker and (F) a condensation cure catalyst.

7. The curable polyorganosiloxane composition according to claim 6, wherein:
component (E) comprises at least one hydrolysable crosslinker selected from the group consisting of vinyltrimethoxysilane, 1,6-bis(trimethoxysilyl)hexane, 1,8-bis(trimethoxysilyl)octane, and γ-(meth)acryloxypropyltrimethoxysilane; and
component (F) comprises a metal or non-metal condensation cure catalyst.

8. The curable polyorganosiloxane composition according to claim 3, wherein component (A) is the siloxane-based polymer, in which any one of $R_5$ and $R_6$ in the structural formula (I) or (II) comprises a C2-C20 alkenyl group at one terminal, and the other of $R_5$ and $R_6$ in the structural formula (I) or (II) comprises a hydroxy or hydrolysable functional group at the other terminal, and the hydrolysable functional group is represented by the following structural formula (III') or (IV'):

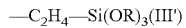—C$_2$H$_4$—Si(OR)$_3$(III')

—C$_2$H$_4$—SiMe$_2$-OSiMe$_2$-C$_2$H$_4$Si(OR)$_3$(IV')

wherein, R represents a substituted or unsubstituted C1-C20 alkyl group, or a substituted or unsubstituted C6-C30 aryl group; and further comprising:
at least one of (C) a crosslinking component, (D) a hydrosilylation catalyst, (E) a hydrolysable crosslinker, and (F) a condensation cure catalyst.

9. The curable polyorganosiloxane composition according to claim 8, further comprising component (D), and wherein component (D) comprises a platinum group metal, an organometallic compound thereof, or a mixture thereof.

10. The curable polyorganosiloxane composition according to claim 8, wherein:
component (E) comprises at least one hydrolysable crosslinker selected from the group consisting of vinyltrimethoxysilane, 1,6-bis(trimethoxysilyl)hexane, 1,8-bis(trimethoxysilyl)octane, and γ-(meth)acryloxypropyltrimethoxysilane; and
component (F) comprises a metal or non-metal condensation cure catalyst.

11. The curable polyorganosiloxane composition according to claim 1, further comprising at least one of (G) an acrylate monomer, (H) a silicone resin, (I) a filler, (J) a solvent, and (K) a cure additive.

12. The curable polyorganosiloxane composition according to claim 11, wherein:
component (G) comprises at least one acrylate monomer selected from the group consisting of ethyl(meth)acrylate, n-propyl(meth)acrylate, isopropyl(meth)acrylate, n-butyl(meth)acrylate, tert-butyl(meth)acrylate, sec-butyl(meth)acrylate, pentyl(meth)acrylate, 2-ethylhexyl(meth)acrylate, n-octyl(meth)acrylate, isooctyl(meth)acrylate, isononyl(meth)acrylate, lauryl(meth)acrylate, tetradecyl(meth)acrylate, and isostearyl(meth)acrylate;
component (H) comprises at least one MQ resin;
component (I) comprises at least one filler selected from the group consisting of a fumed silica or alumina fine powder, a precipitated silica or alumina fine powder, a baked silica or alumina fine powder, and a fumed titanium oxide fine powder;
component (J) comprises an organic solvent or a non-crosslinkable silicone solvent; and
component (K) comprises at least one cure additive selected from the group consisting of a hydrogen donor, a reducing agent, a CO$_2$ producer, a singlet oxygen scavenger, and a N-vinyl amide.

13. The curable polyorganosiloxane composition according to claim 1, wherein component (B) comprises at least one photoinitiator selected from the group consisting of acetophenone-, benzophenone-, thioxanthone-, benzoin-, triazine-, oxime-, carbazole-, diketone-, sulfonium borate-, diazo-, imidazole-, and biimidazole-based compounds.

14. A cured body obtained by curing the curable polyorganosiloxane composition according to claim 1.

15. The cured body according to claim 14, wherein the cured body is selected from the group consisting of coatings, encapsulants, sealants, and adhesives.

16. An electronic device comprising the cured body according to claim 14.

17. A manufacturing process of an electronic device, the process comprising sealing the electronic device with a cured body obtained by curing the curable polyorganosiloxane composition according to claim 1.

* * * * *